United States Patent [19]

Keown et al.

[11] Patent Number: 5,218,243
[45] Date of Patent: Jun. 8, 1993

[54] BICMOS TTL OUTPUT BUFFER CIRCUIT WITH REDUCED POWER DISSIPATION

[75] Inventors: Susan M. Keown, Portland; Roy L. Yarbrough, Hiram, both of Me.

[73] Assignee: National Semiconductor Corporation, Santa Clara, Calif.

[21] Appl. No.: 796,455

[22] Filed: Nov. 20, 1991

[51] Int. Cl.[5] ............... H03K 19/02; H03K 19/00
[52] U.S. Cl. ..................... 307/446; 307/296.3; 307/473; 307/475
[58] Field of Search ............. 307/446, 475, 473, 296.3

[56] References Cited

U.S. PATENT DOCUMENTS

| | | | |
|---|---|---|---|
| 4,255,670 | 3/1981 | Griffith | 307/473 |
| 4,287,433 | 9/1981 | Goodspeed | 307/473 |
| 4,678,943 | 7/1987 | Uragami et al. | 307/446 |
| 4,808,850 | 2/1989 | Masuda et al. | 307/446 |
| 4,839,537 | 6/1989 | Ueno | 307/446 |
| 4,845,386 | 7/1989 | Ueno | 307/446 |
| 4,877,975 | 10/1989 | Ueno | 307/446 |
| 5,124,582 | 6/1992 | Nakamura et al. | 307/446 |

Primary Examiner—Edward P. Westin
Assistant Examiner—Richard Roseen
Attorney, Agent, or Firm—Daniel H. Kane; James W. Rose; Richard C. Calderwood

[57] ABSTRACT

In a BICMOS TTL output buffer circuit, bipolar output pullup and pulldown transistors (Q3,Q4,Q5) source and sink current at an output ($V_{OUT}$). A phase splitter transistor (Q2,N4) is coupled to the bipolar output pullup and pulldown transistors for controlling respective conducting states in response to data signals at an input ($V_{IN}$) during the active bistate mode of operation. CMOS tristate transistors (P1, ,P2,P4,N2) form a tristate circuit for implementing an inactive tristate mode at the output $V_{OUT}$ in response to tristate enable signals at a tristate enable input (OE). In order to reduce quiescent input current ($I_{CC}$) power dissipation, an input power switch CMOS transistor (NI,N4,P1A) is coupled in the input current path to the high potential power rail ($V_{CCI}$). The control gate node of the input power switch CMOS transistor (N1, ,N4,P1A) is coupled to the input ($V_{IN}$) to control sourcing of input current ($I_{CC}$) in response to data signals at the input during the active mode for reducing power dissipation. In the preferred example the input power switch CMOS transistor (N4) replaces and comprises the phase splitter transistor of the output buffer circuit. Dual CMOS phase splitter transistors (N4,N3) are also provided with the second dual CMOS phase splitter transistor (N3) coupled in an accelerating feedback circuit between the output ($V_{OUT}$ and the output pulldown transistor (Q5).

10 Claims, 3 Drawing Sheets

BICMOS TTL OUTPUT BUFFER CIRCUIT WITH REDUCED POWER DISSIPATION

TECHNICAL FIELD

This invention relates to a new BICMOS TTL output buffer circuit with reduced power requirements. The invention reduces static input current $I_{CC}$ for either inverting or non-inverting tristate output buffer circuits during the active mode by incorporating input power switch CMOS transistors. The invention also accomplishes this objective by providing new BICMOS TTL output buffer circuits with single and dual CMOS phase splitter transistors.

BACKGROUND ART

A conventional tristate BICMOS TTL output buffer circuit is illustrated in FIG. 1. The example of FIG. 1 is an inverting output buffer circuit delivering low and high potential level output signals at the output $V_{OUT}$ in response to high and low potential level data signals at the input $V_{IN}$. The output pullup and pulldown transistors are bipolar transistors. The pullup Darlington transistor pair Q3,Q4 sources current to the output $V_{OUT}$ from an output high potential power rail $V_{CCI}$ through Schottky diode SD9. The pulldown transistor Q5 provided by high current drive parallel transistor elements Q5A,Q5B sinks current from the output $V_{OUT}$ to the low potential power rail GNDO. The bipolar phase splitter transistor Q2 controls the conducting states of the respective pullup and pulldown transistors in opposite phase in response to data signals at the input $V_{IN}$. The input $V_{IN}$ is coupled to the base node of phase splitter transistor Q2 through input Schottky diode SD4.

With a high potential level signal at the input $V_{IN}$ phase splitter transistor Q2 is conducting and turns on the pulldown transistor Q5. Discharge current from the output $V_{OUT}$ assists in the turn on of the pulldown transistor Q5 through an accelerating feedback circuit provided by bipolar feedback transistor Q1 having a base node coupled to the input high potential power rail $V_{CCI}$ through resistor R3. The input and output high potential power rails $V_{CCI}$, $V_{CCO}$ may be relatively isolated from each other for noise reduction by, for example, a split lead leadframe or by separate supply rails and pins. The phase splitter transistor Q2 is coupled to the input high potential power rail $V_{CCI}$ through collector resistor R1. It discharges the base and turns off pullup transistor Q3. Alternative discharge paths through Schottky diode SD1 and through resistor R2 and Schottky diode SD6 accelerate turn off of pullup transistor Q4.

With a low potential level data signal at the input $V_{IN}$ the phase splitter transistor Q2 turns off and the base of the pulldown transistor Q5 is discharged through resistor R4. To prevent turn on of pulldown transistor Q5 by capacitive feedback Miller current during charging of load capacitance and transition from low to high potential level at the output $V_{OUT}$, an AC Miller killer circuit (ACMK) Q6,SD5,D1,SD1 is coupled to the base node of pulldown transistor elements Q5A,Q5B. The ACMK discharging parasitic base drive feedback Miller current to the low potential power rail GNDO.

A tristate circuit for implementing an inactive high impedance tristate condition at the output $V_{OUT}$ is provided by CMOS transistors P1,P2,P4,N2 having control gate nodes coupled to tristate enable input OE. For the active bistate mode of operation at the output $V_{OUT}$, a low potential level OE signal turns on the tristate PMOS transistors P1,P2,P4. The tristate PMOS transistors provide low impedance coupling of the input high potential power rail $V_{CCI}$ to the input, phase splitter and feedback circuits. Tristate NMOS transistor N2 is also coupled to the tristate enable input OE. With the low potential level OE signal, tristate NMOS transistor N2 is non-conducting blocking the path to low potential power rail GNDO from the base node of output pulldown transistor Q5 for active operation in the bistate mode.

The tristate enable circuitry also incorporates Schottky diodes SD2,SD3 coupled between the respective base nodes of pullup transistor Q3 and feedback transistor Q1, and a complementary tristate enable input OEB. With a high potential level OEB signal, this path is blocked for bistate operation at the output $V_{OUT}$ in the active mode.

The tristate circuitry disables the output $V_{OUT}$ in a high impedance third state with tristate enable high potential OE signal and low potential OEB signal. The high potential level OE signal turns off tristate PMOS transistors P1,P2, and P4 isolating the input, phase splitter and feedback circuits from the high potential power rail $V_{CCI}$. Tristate NMOS transistor N2 turns on and disables the bipolar pulldown transistor Q5. The low potential level OEB signal disables the bipolar pullup transistors Q3,Q4 as well as the bipolar feedback transistor Q1 through Schottky diode paths SD2,SD3.

A disadvantage of the tristate BICMOS TTL output buffer circuit of FIG. 1 is the high power dissipation during active operation in the bistate mode. With a low potential level data signal at the input $V_{IN}$ holding off the phase splitter transistor Q2, a steady state or quiescent input current $I_{CC}$ continues to flow from the high potential power rail $V_{CCI}$ through tristate transistor P1, resistor R5 and input diode SD4 to the input node $V_{IN}$. This quiescent current continues for the duration of a low potential level signal at the input $V_{IN}$.

It should also be noted in the conventional BICMOS TTL output buffer circuit of FIG. 1 that CMOS transistors are introduced in the essentially bipolar TTL output buffer circuit only in the tristate enable circuit. The CMOS transistors P1,P2,P4,N2 are limited to the power circuit paths for connecting or disconnecting the bipolar output buffer circuit elements with respect to the high and low potential power rails. The tristate CMOS transistors P1,P2,P4,N2 are controlled only by power signals at the tristate enable circuit input OE, and are not incorporated into the data path.

In the previous technology of bipolar tristate output buffer circuits, dual bipolar phase splitters have been used to reduce power dissipation. For example the Steven N. Goodspeed U.S. Pat. No. 4,287,433 describes a TRANSISTOR LOGIC TRISTATE OUTPUT WITH REDUCED POWER DISSIPATION with an all bipolar tristate enable circuit. This circuit reduces power dissipation, however, in an entirely different context power. Dissipation through the all bipolar tristate enable circuit is reduced during the inactive tristate mode of operation.

Dual bipolar phase splitter transistors are also described in the Paul J. Griffith U.S. Pat. No. 4,255,670 for a TRANSISTOR LOGIC TRISTATE OUTPUT WITH FEEDBACK. In this circuit the second phase splitter transistor is used to define an accelerating feedback circuit from the output to the base of the pulldown transistor without connection to the tristate enable circuit. The bipolar enable gate is therefore separated from the output. Furthermore in these two U.S. Pat. references the concept and context of dual phase splitter transistor circuits is limited entirely to all bipolar transistor output buffer circuits.

OBJECTS OF THE INVENTION

It is therefore an object of the present invention to provide a BICMOS TTL output buffer circuit with reduced power dissipation. The invention is particularly applicable for BICMOS TTL tristate output buffer circuits.

Another object of the invention is to provide a tristate BICMOS TTL output buffer circuit with CMOS transistors thoroughly integrated into the output buffer circuit including the data paths for better control of power dissipation.

A further object of the invention is to provide new BICMOS TTL output buffer circuits having CMOS phase splitter transistors including dual CMOS phase splitter transistors for performing parallel control functions in the output buffer circuit.

DISCLOSURE OF THE INVENTION

In order to accomplish these results the invention provides a BICMOS TTL output buffer circuit having an input power switch CMOS transistor with a control gate node coupled to the input. The primary current path of the input power switch CMOS transistor is coupled to a high potential power rail to control sourcing of input current $I_{CC}$ to the output buffer circuit in response to data signals at the input. The power switch CMOS transistor reduces input current $I_{CC}$ during one of the high or low potential level data signals at the input during the active bistate mode of operation of the output buffer circuit.

For an inverting output buffer circuit, the input power switch CMOS transistor is an NMOS transistor. For a non-inverting output buffer circuit, the input power switch CMOS transistor is a PMOS transistor. Typically, the input power switch CMOS transistor is coupled in series with a CMOS tristate transistor to the high potential power rail.

According to one example embodiment, the phase splitter transistor is a bipolar transistor element and the input power switch CMOS transistor is coupled between the high potential power rail and a base node of the phase splitter transistor. The gate node of the power switch CMOS transistor is coupled to the input for controlling the conducting state of the phase splitter transistor in response to data signals at the input.

A feature of this circuit arrangement is that the input node is coupled to the base node of the phase splitter transistor only through the primary current path of the input power switch CMOS transistor. Quiescent input current $I_{CC}$ to the input node $V_{IN}$ during the active bistate mode of operation at the output is cut off, reducing unnecessary power dissipation. A separate discharge path to the low potential power rail discharges the base node of the phase splitter transistor for turning off the phase splitter transistor.

According to the preferred example embodiment, the input power switch CMOS transistor replaces and comprises the phase splitter transistor of the BICMOS TTL output buffer circuit. The control gate node of the input power switch CMOS phase splitter transistor is coupled to the input and the primary current path is coupled between the output pullup and pulldown transistors according to the practice in phase splitter circuits.

An advantage of the CMOS phase splitter transistor in the BICMOS TTL output buffer circuit is that the CMOS phase splitter transistor in the data path can also function as a current switch for controlling power dissipation. A further advantage of the CMOS phase splitter transistor is that the power level and speed of the output buffer circuit may be reduced for controlling switching noise at the output. The input power switch CMOS phase splitter transistor is coupled in series with tristate CMOS transistors between the high and low potential power rails.

The invention also provides dual CMOS phase splitter transistors for performing separate CMOS switch transistor control functions. The first CMOS dual phase splitter transistor is coupled between the bipolar output pullup and pulldown transistors for performing the traditional phase splitting control function. The second dual CMOS phase splitter transistor is coupled in a feedback path and accelerating feedback circuit between the output and the output pulldown transistor. The second dual CMOS phase splitter transistor therefore provides a feedback power switch CMOS transistor in the accelerating feedback circuit. The gate node of the first and second CMOS phase splitter transistors are coupled in parallel to the input while the primary current paths are coupled in parallel to the output pulldown transistor for accelerating turn on of the output pulldown transistor and transition from high to low potential level at the output. Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
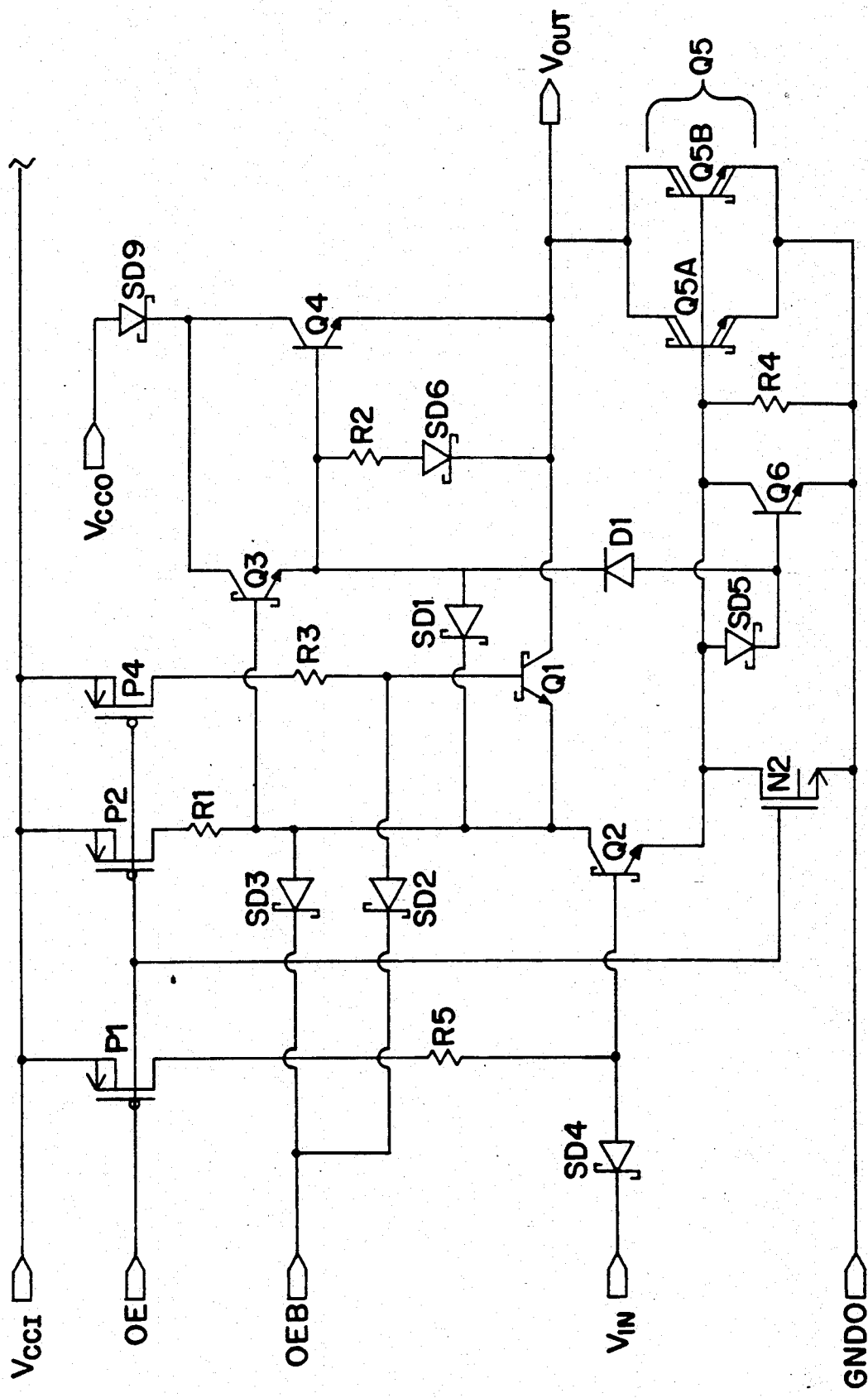
FIG. 1 is a schematic circuit diagram of a prior art tristate BICMOS TTL output buffer circuit.
Figure 2A:
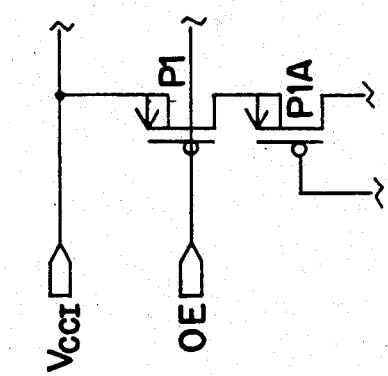
FIG. 2A is a fragmentary schematic circuit diagram of a portion of the circuit of FIG. 2 modified to provide a non-inverting tristate BICMOS TTL output buffer circuit with reduced power dissipation.
Figure 2:
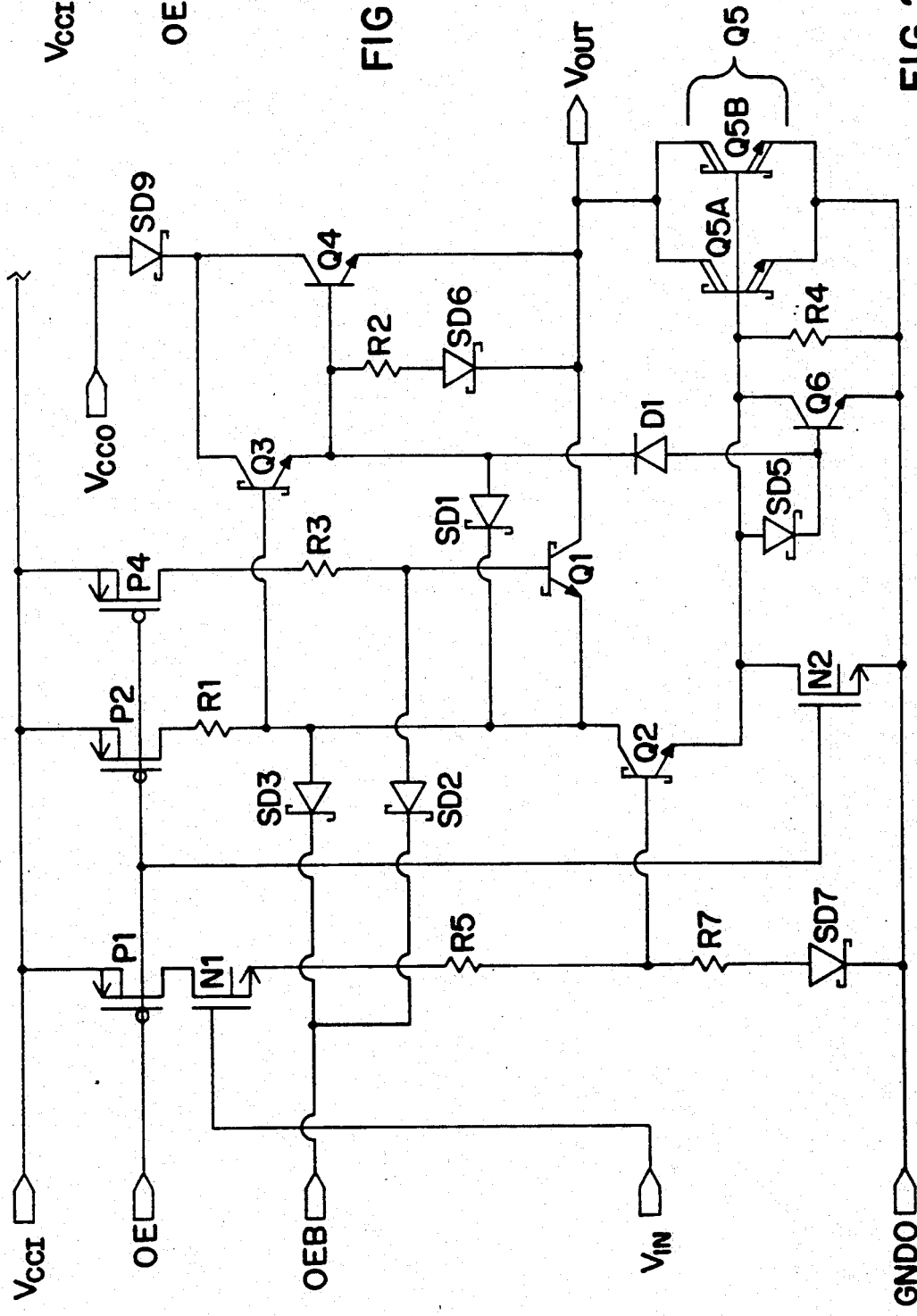
FIG. 2 is a schematic circuit diagram of an inverting tristate BICMOS TTL output buffer circuit incorporating an input power switch CMOS transistor in the data path for reduced power dissipation according to the invention.

A tristate BICMOS TTL output buffer circuit according to the invention is illustrated in FIG. 2. Circuit components and elements performing the same or similar function as those in the circuit of FIG. 1 are indicated by the same reference designation. An input power switch or input current switch CMOS transistor N1 is incorporated in the input current path from input high potential power rail $V_{CCI}$. The drain node of NMOS transistor N1 is coupled to $V_{CCI}$ through PMOS tristate transistor P1, while the source node is coupled to the base node of phase splitter transistor Q2 through base drive resistor R5. The control gate node of input power switch transistor N1 is coupled to the data signal input $V_{IN}$ for switching of transistor N1 in response to data signals.

As shown in FIG. 2, the input $V_{IN}$ is no longer coupled directly through a passive circuit element to the base node of bipolar phase splitter transistor Q2. The data signal input $V_{IN}$ is coupled to the base node of Q2 only through control of the primary current path through input power switch transistor N1. For a low potential level data signal at the input $V_{IN}$, NMOS transistor N1 turns off, cutting off he quiescent input current $I_{CC}$ and substantially reducing the power requirements of the circuit. The base of phase splitter transistor Q2 is discharged through the separate voltage drop component discharge path R7,SD7 provided between the base node of Q2 and the low potential power rail GNDO.

It is noted that while input power switch transistor N1 controls the input power current $I_{CC}$, it does so through the data path, coupled to the data signal input. As an NMOS transistor, input power switch transistor N1 operates in phase with the input data signal so that the output buffer circuit remains inverting. For a non-inverting output buffer circuit, input power switch transistor N1 is replaced with a PMOS transistor P1A as shown in FIG. 2A.

Figure 3:
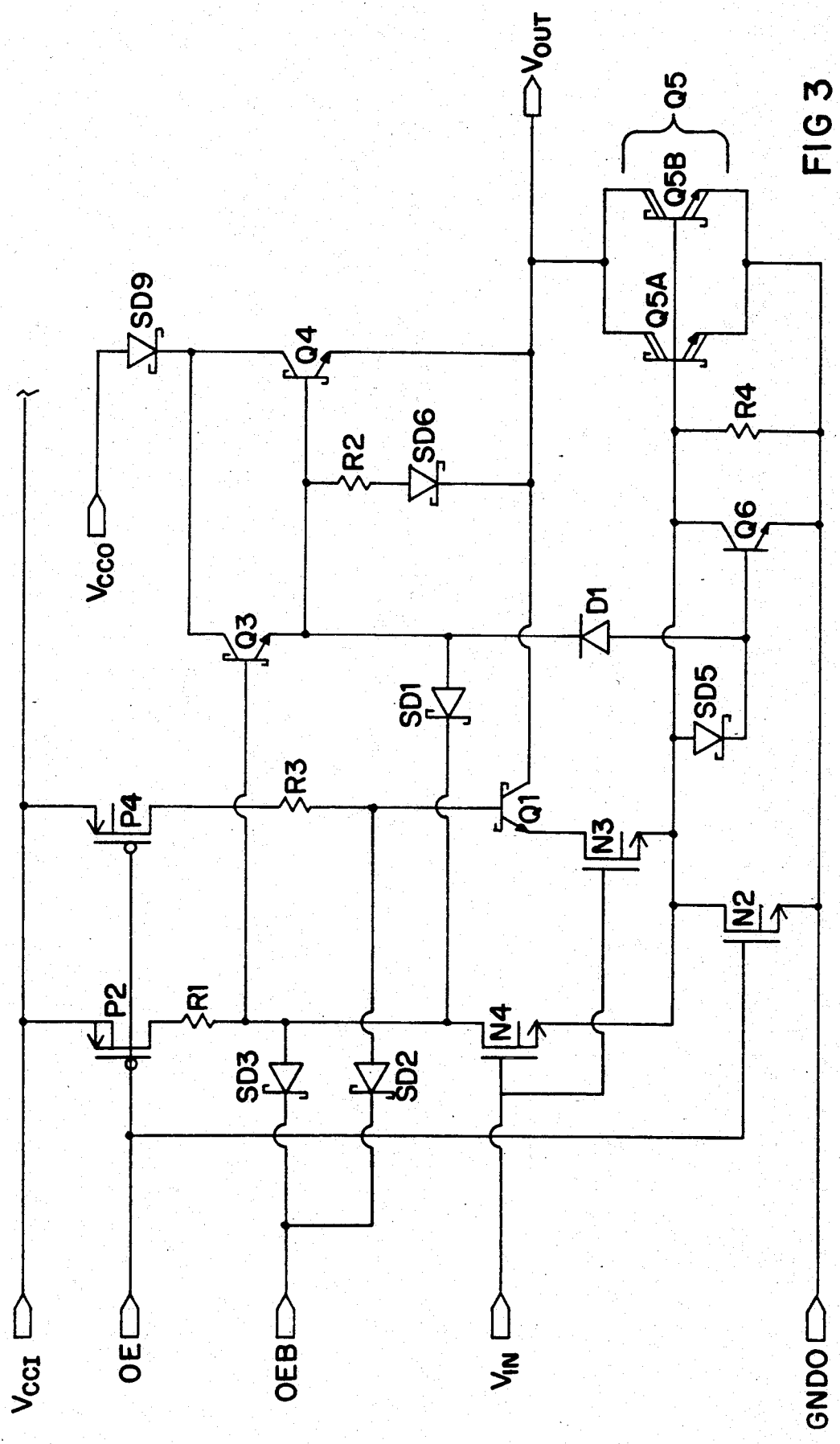
FIG. 3 is a schematic circuit diagram of a tristate BICMOS TTL output buffer circuit with dual CMOS phase splitter transistors according to the invention.

A preferred example embodiment of the invention is illustrated in FIG. 3. In this example, a bipolar amplification stage of the output buffer circuit is eliminated, and the input power switch CMOS transistor N4 is substituted for the bipolar phase splitter transistor Q2. The primary current path through drain and source nodes of CMOS phase splitter transistor N4 is coupled between the bipolar output pullup Darlington transistor Q3,Q4, and the bipolar output pulldown transistor Q5 composed of parallel high current drive transistor elements Q5A,Q5B. The control gate node of NMOS phase splitter transistor N4 is coupled to the input $V_{IN}$ for direct control of the respective conducting states of output pullup and pulldown transistors Q3,Q4,Q5. The primary current path of NMOS phase splitter transistor N4 is also coupled between the high and low potential power rails $V_{CCI}$, GND through respective tristate CMOS transistors P2,N2.

By using an NMOS phase splitter transistor N4, the output buffer circuit of FIG. 3 remains an inverting output buffer circuit. For a true or non-inverting output buffer circuit, a PMOS or P channel phase splitter transistor may be used instead of the NMOS phase splitter transistor N4. In substituting a PMOS phase splitter transistor it is necessary that the fabrication process technology achieve a control gate threshold voltage sufficiently high for coupling to the data signal input $V_{IN}$. This may be achieved in more advanced CMOS process technologies. Alternatively, an additional bipolar stage of amplification following the source of the PMOS phase splitter transistor may be used to add an additional $V_{BE}$ voltage drop increasing the threshold voltage at the control gate node of the PMOS phase splitter transistor.

As shown in the example of FIG. 3, a second dual CMOS phase splitter transistor N3 may be added to the circuit for performing a separate current switch control function. In this implementation, NMOS transistor N3 is incorporated in the accelerating feedback circuit to provide a feedback power switch CMOS transistor. The control gate nodes of the dual NMOS phase splitter transistors N4,N3 are coupled to the input $V_{IN}$. The source nodes are coupled to the base node of the output pulldown transistor Q5. While the drain node of the first dual NMOS phase splitter transistor N4 is coupled to the output pullup transistors Q3,Q4, the drain node of the second dual NMOS phase splitter transistor N3 is coupled to the bipolar feedback transistor Q1 in the accelerating feedback circuit. The second parallel dual NMOS phase splitter transistor N3 therefore provides accelerated turn on of the output pulldown transistor Q5.

In the output buffer circuit of FIG. 3 the power switch CMOS transistors in the form of dual NMOS phase splitter transistors N4,N3 are again incorporated directly in the data path. The NMOS transistors N4,N3 therefore each perform dual functions of switching off current and power for reducing power requirements and also passing data signals in the data path.

While the invention has been described with reference to particular example embodiments it is intended to cover all modifications and equivalents within the scope of the following claims.

We claim:

1. A BICMOS output buffer circuit having bipolar output pullup and pulldown transistors (Q3,Q4,Q5) for sourcing and sinking current at an output ($V_{OUT}$), and a phase splitter transistor coupled to the bipolar output pullup and pulldown transistors for controlling respective conducting states in response to high and low potential level data signals at an input ($V_{IN}$) during an active mode of operation of the output buffer circuit, the improvement comprising:

an input power switch CMOS transistor (N1, P1A) having a control gate node coupled to the input ($V_{IN}$), said input power switch CMOS transistor having a primary current path coupled to a high potential power rail ($V_{CCI}$) to control sourcing of input current ($I_{CC}$) to the phase splitter transistor;

said phase splitter transistor element (Q2) being a bipolar transistor element, and said input power switch CMOS transistor (N1, P1A) having a primary current path coupled between the high potential power rail ($V_{CCI}$) and a base node of the phase splitter transistor (Q2), the gate node of the power switch CMOS transistor (N1) being coupled to the input $V_{(IN)}$ for controlling the conducting state of the phase splitter transistor (Q2) in response to data signals;

and a voltage drop component discharge path (R7, SD7) coupled between the base node of the phase splitter transistor (Q2) and the low potential power rail (GNDO).

2. The BICMOS TTL output buffer circuit of claim 1 further comprising CMOS tristate transistors (P1,P2,P4,N2) for implementing an inactive tristate mode at the output $V_{OUT}$ in response to tristate enable signals at a tristate enable input (OE), and wherein the input power switch CMOS transistor (N1,P1A) is coupled in series with a CMOS tristate transistor (P1) to the high potential power rail ($V_{CCI}$).

3. The BICMOS TTL output buffer circuit of claim 1 wherein the output buffer circuit is an inverting output buffer circuit and the input power switch CMOS transistor (N1) is an NMOS transistor element.

4. The BICMOS TTL output buffer circuit of claim 1 wherein the output buffer circuit is a non-inverting output buffer circuit and wherein the input power switch CMOS transistor (P1A) is a PMOS transistor.

5. The BICMOS TTL output buffer circuit of claim 2 for implementing an inactive tristate mode at the output $V_{OUT}$ in response to tristate enable signals at a tristate enable input wherein the phase splitter transistor Q2 is coupled in series with tristate CMOS transistors (P2, N2) between the high and low potential power rials ($V_{CCI}$, GNDO).

6. A BICMOS TTL output buffer circuit having bipolar output pullup and pulldown transistors (Q3,Q4,Q5) for sourcing and sinking current at an output ($V_{OUT}$) in response to high and low potential level data signals at an input ($V_{IN}$) during an active mode of operation of the output buffer circuit, the improvement for reducing input current ($I_{CC}$) power consumption during the active mode, comprising:

dual phase splitter CMOS transistors (N4,N3) coupled in the output buffer circuit with respective control gate nodes coupled to the input ($V_{IN}$), said dual phase splitter CMOS transistors (Q4,N3) having primary current paths coupled to the output pulldown transistor (Q5), a first dual phase splitter CMOS transistor (N4) having the primary current path coupled to the pullup transistor (Q3,Q4), the second dual phase splitter CMOS transistor (N3) having the primary current path coupled in a feedback path to the output ($V_{OUT}$);

and CMOS tristate transistors (P2,P4,N2) for implementing an inactive tristate mode at the output $V_{OUT}$ in response to tristate enable signals at a tristate enable input (OE), said first dual phase splitter CMOS transistor (N4) being coupled in series with CMOS tristate transistors (P2,N2) between the high and low potential power rails ($V_{CCI}$,GNDO);

said second dual phase splitter CMOS transistor (N3) being coupled in a feedback path having a bipolar feedback transistor (Q1) with a base node coupled to the high potential power rail ($V_{CCI}$) through a CMOS tristate transistor (P4).

7. A BICMOS TTL output buffer circuit having bipolar output pullup and pulldown transistors (Q3,Q4,Q5) for sourcing and sinking (Q2) coupled to the bipolar output pullup and pulldown transistors (Q3,Q4,Q5) for controlling respective conducting states in response to high and low potential level data signals at an input ($V_{IN}$) during an active mode of operation of the output buffer circuit, and the improvement for reducing input current ($I_{CC}$) power consumption during the active mode, comprising:

an input power switch CMOS transistor (N1, P1A) having a control gate node coupled to the input ($V_{IN}$), said input power switch CMOS transistor (N1,P1A) being coupled between the high potential power rail ($V_{CCI}$) and a base node of the phase splitter transistor (Q2) to control sourcing of base drive current to the phase splitter transistor (Q2) in response to high and low potential level data signals at the input ($V_{IN}$) during the active mode;

and a voltage drop component discharge path R7,SD7 coupled between the base node of the phase splitter transistor (Q2) and the low potential power rail (GNDO).

8. The BICMOS TTL output buffer circuit of claim 7 wherein the output buffer circuit is an inverting output buffer circuit and wherein the input power switch CMOS transistor (N1) is an NMOS transistor.

9. The BICMOS TTL output buffer circuit of claim 7 wherein the output buffer circuit is a non-inverting output buffer circuit, and wherein the input power switch CMOS transistor (P1A) is a PMOS transistor.

10. The BICMOS TTL output buffer circuit of claim 7 further comprising CMOS tristate transistors (P1,P2,P4,N2) for implementing an inactive tristate mode at the output $V_{OUT}$ in response to tristate enable signals at a tristate enable input (OE), and wherein the input power switch CMOS transistor (N1,P1A) is coupled in series with a CMOS transistor (N1,P1A) is coupled in series with a CMOS tristate transistor (P1) to the high potential power rail ($V_{CCI}$).

* * * * *